United States Patent
Choi et al.

(10) Patent No.: US 8,012,779 B2
(45) Date of Patent: Sep. 6, 2011

(54) GALLIUM NITRIDE-BASED LIGHT EMITTING DIODE AND METHOD OF MANUFACTURING THE SAME

(75) Inventors: Seok Beom Choi, Daejeon (KR); Bang Won Oh, Seongnam (KR); Jong Gun Woo, Suwon (KR); Doo Go Baik, Suwon (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 380 days.

(21) Appl. No.: 11/878,360

(22) Filed: Jul. 24, 2007

(65) Prior Publication Data

US 2008/0035953 A1 Feb. 14, 2008

(30) Foreign Application Priority Data

Aug. 14, 2006 (KR) .................. 10-2006-0076592

(51) Int. Cl.
 *H01L 21/00* (2006.01)
 *H01L 33/00* (2010.01)
(52) U.S. Cl. ....... 438/29; 438/39; 438/46; 257/E33.067; 257/E33.068; 257/E33.074; 257/98; 257/79
(58) Field of Classification Search .............. 438/46; 257/79
 See application file for complete search history.

(56) References Cited

U.S. PATENT DOCUMENTS

| 2003/0222263 | A1* | 12/2003 | Choi | 257/79 |
| 2005/0121688 | A1 | 6/2005 | Nagai et al. | |
| 2006/0043384 | A1 | 3/2006 | Cho et al. | |
| 2006/0105542 | A1* | 5/2006 | Yoo | 438/455 |
| 2007/0018187 | A1* | 1/2007 | Lee et al. | 257/98 |
| 2007/0221944 | A1* | 9/2007 | Cheol Yoo | 257/99 |
| 2010/0244079 | A1 | 9/2010 | Orita | |

FOREIGN PATENT DOCUMENTS

| JP | 2003-209283 | 7/2003 |
| JP | 2004-281863 | 10/2004 |
| JP | 2005-072585 | 3/2005 |
| JP | 2005-191530 | 7/2005 |
| JP | 2006-49855 | 2/2006 |
| JP | 2006-196543 | 7/2006 |
| KR | 10-2004-0090465 A | 10/2004 |
| KR | 10-0610639 B1 | 8/2006 |
| KR | 10-0616694 B1 | 8/2006 |

OTHER PUBLICATIONS

Korean Notice of Allowance issued in Korean Patent Application No. KR 10-2006-0076592, dated on Feb. 22, 2008.
Japanese Office Action, w/ English translation thereof, issued in Japanese Patent Application No. JP 2007-125423 dated Oct. 12, 2010.

* cited by examiner

*Primary Examiner* — Ha Tran T Nguyen
*Assistant Examiner* — Aaron A Dehne
(74) *Attorney, Agent, or Firm* — McDermott Will & Emery LLP

(57) ABSTRACT

A vertical GaN-based LED comprises an n-electrode; an n-type GaN layer formed under the n-electrode, the n-type GaN layer having an irregular-surface structure which includes a first irregular-surface structure having irregularities formed at even intervals and a second irregular-surface structure having irregularities formed at uneven intervals, the second irregular-surface structure being formed on the first irregular-surface structure; an active layer formed under the n-type GaN layer; a p-type GaN layer formed under the active layer; a p-electrode formed under the p-type GaN layer; and a structure support layer formed under the p-electrode.

10 Claims, 8 Drawing Sheets

[FIG. 1]
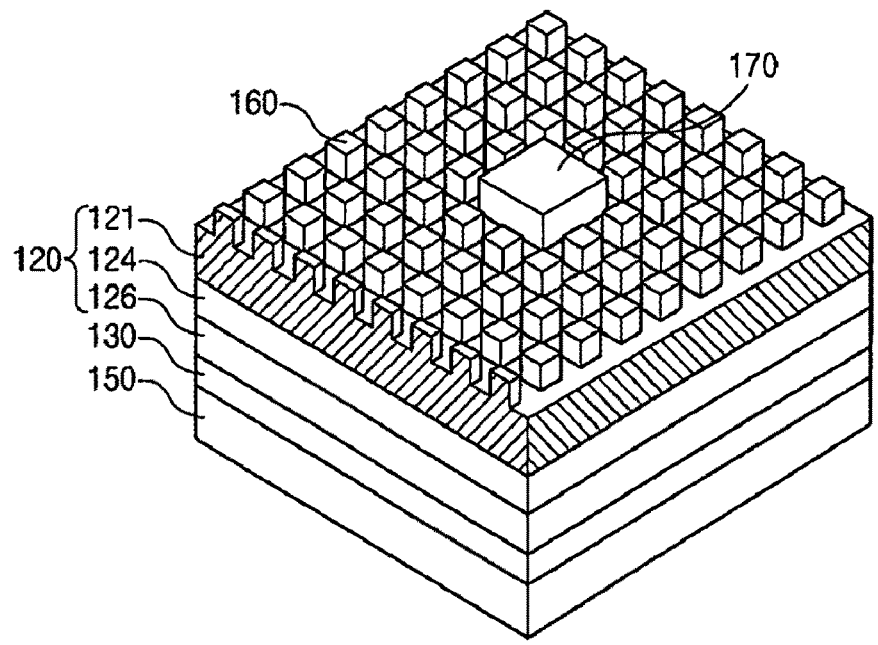
[FIG. 2]
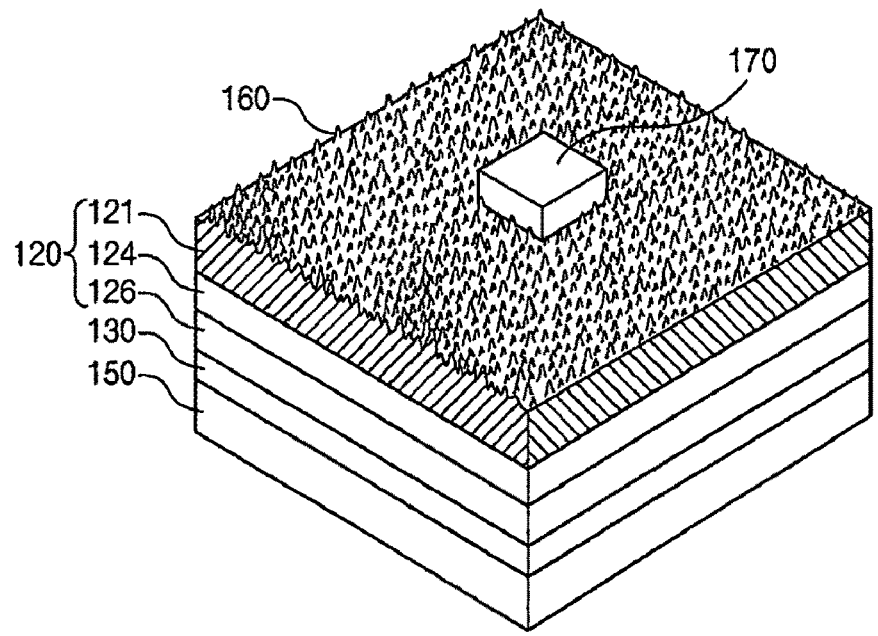

[FIG. 3]
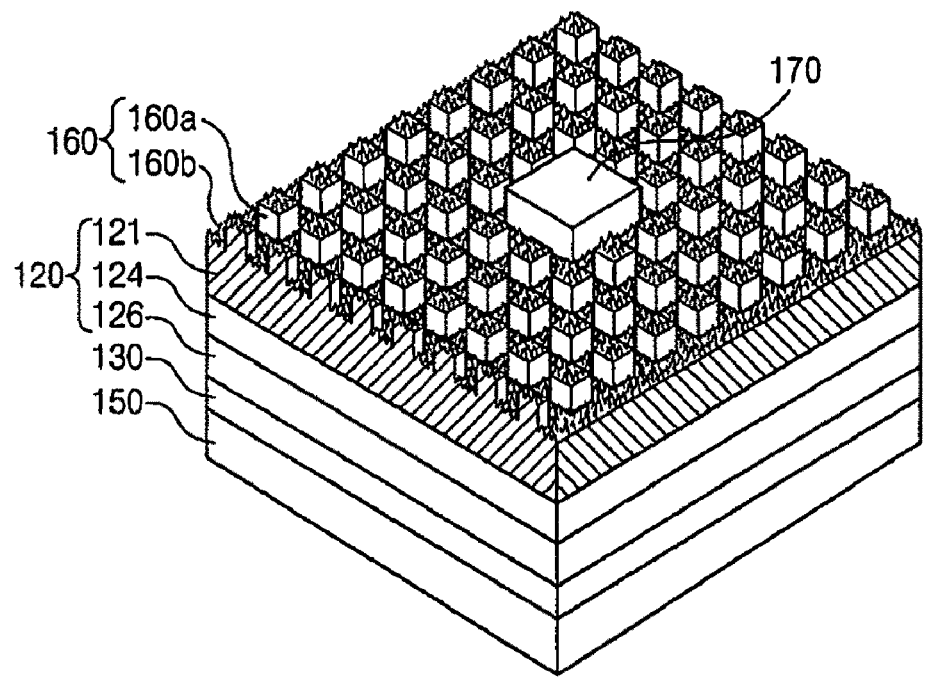

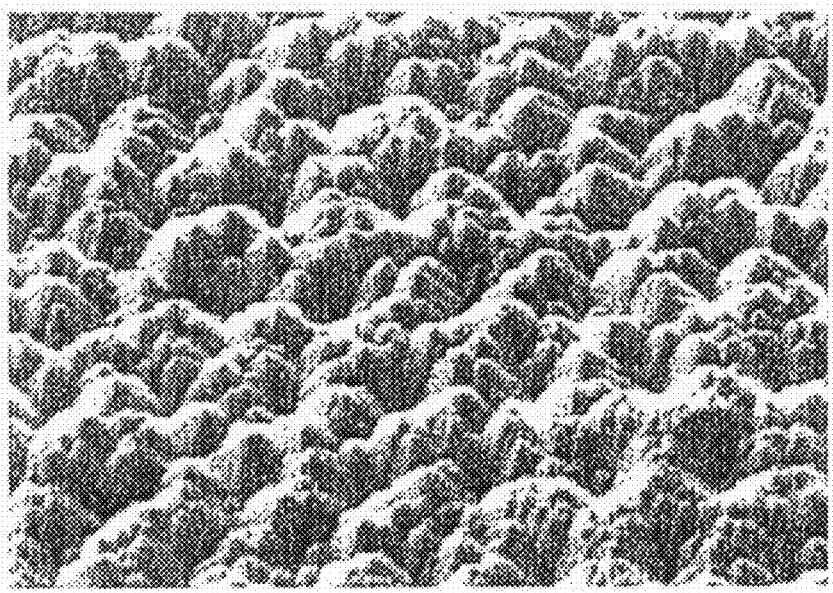
[FIG. 4]

[FIG. 5]
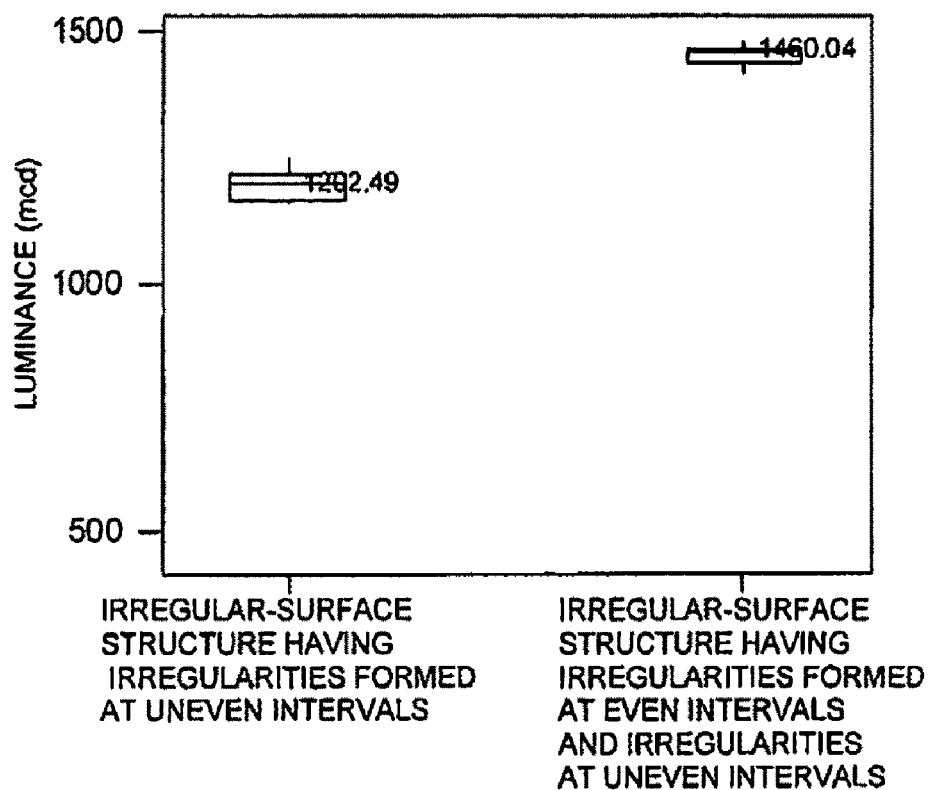
[FIG. 6]
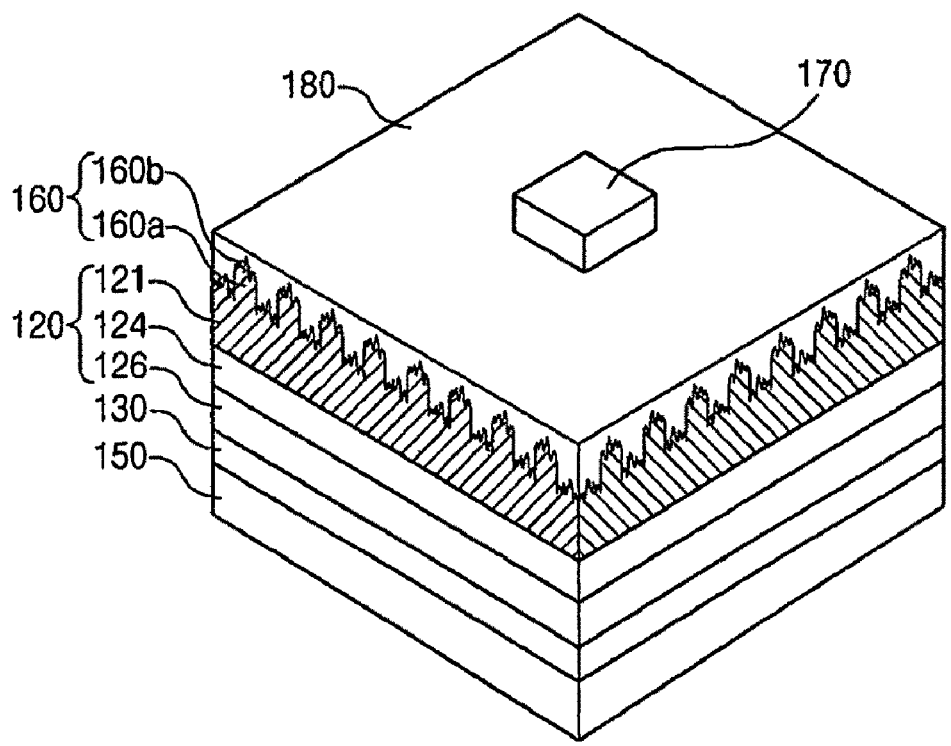

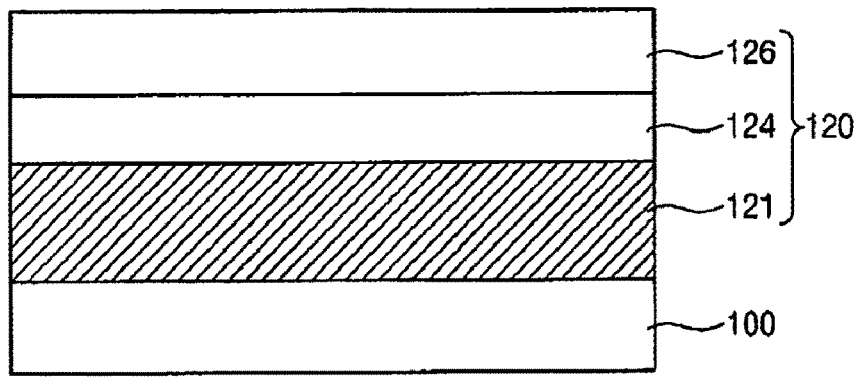
[FIG. 7A]
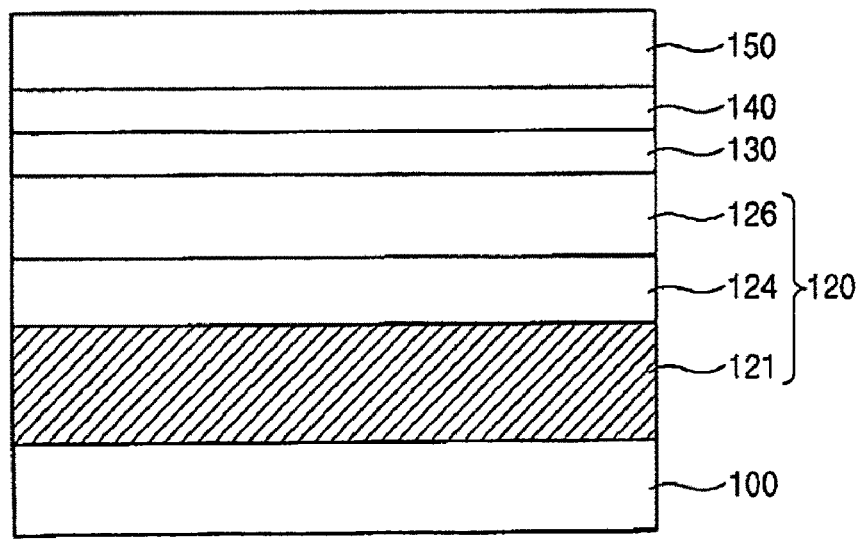
[FIG. 7B]
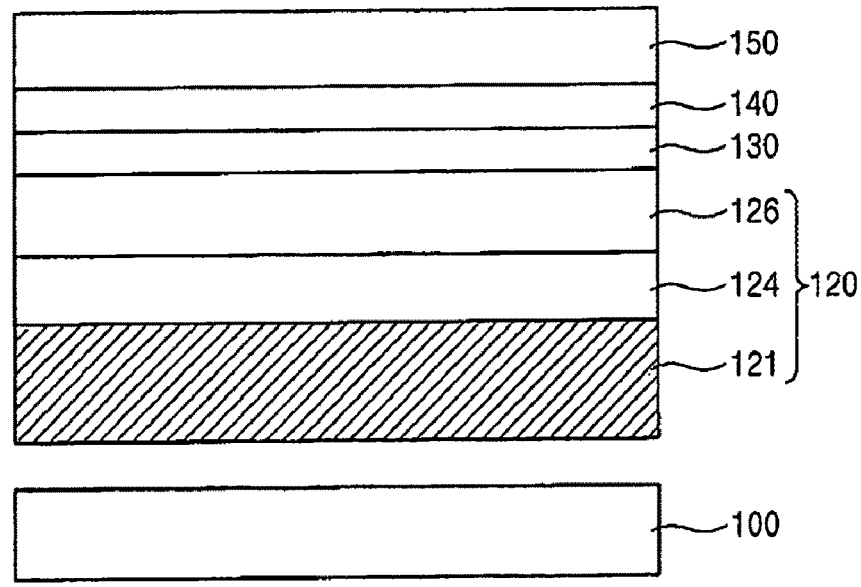
[FIG. 7C]

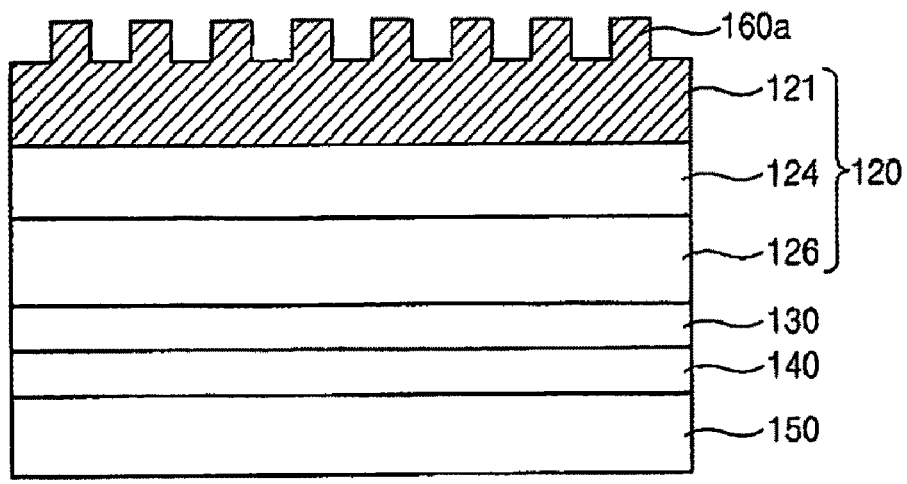
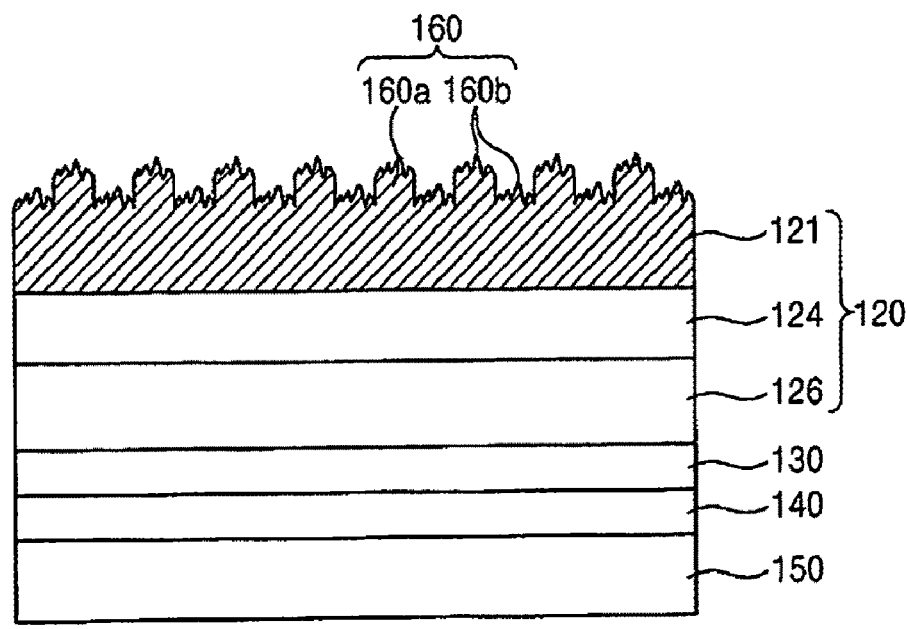
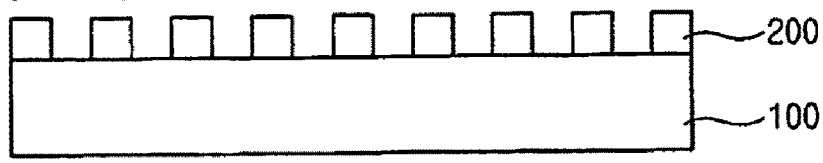

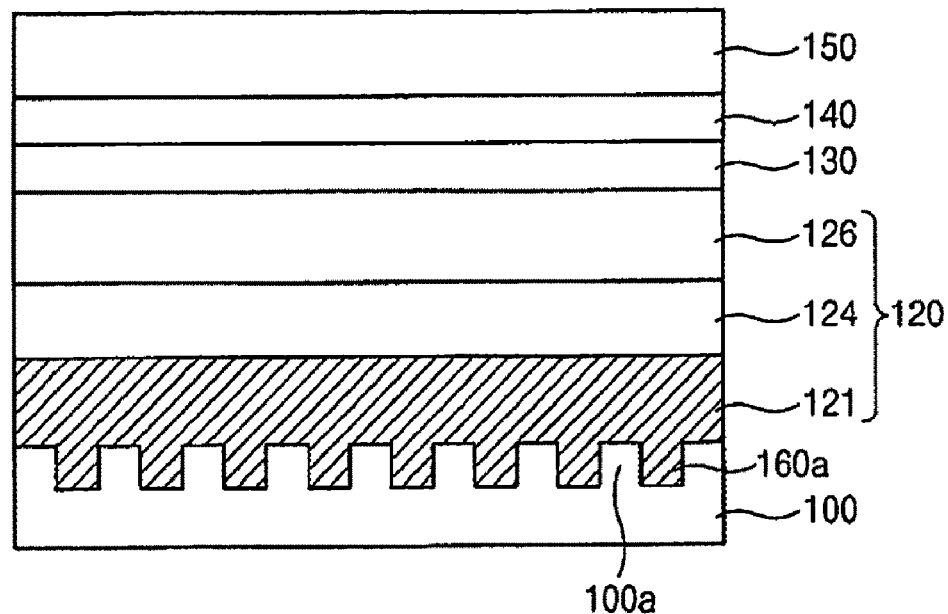
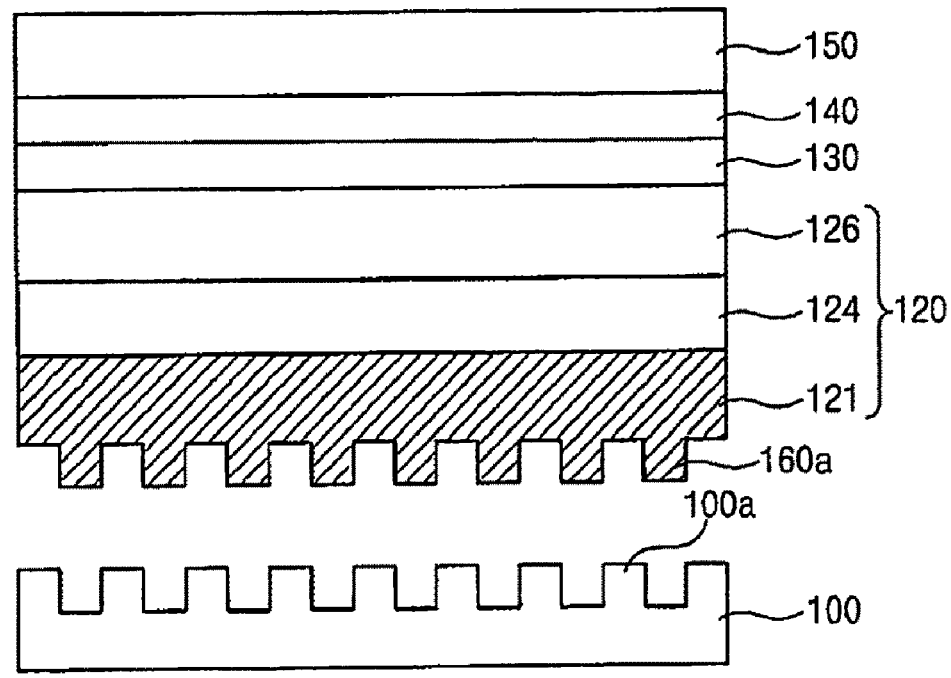

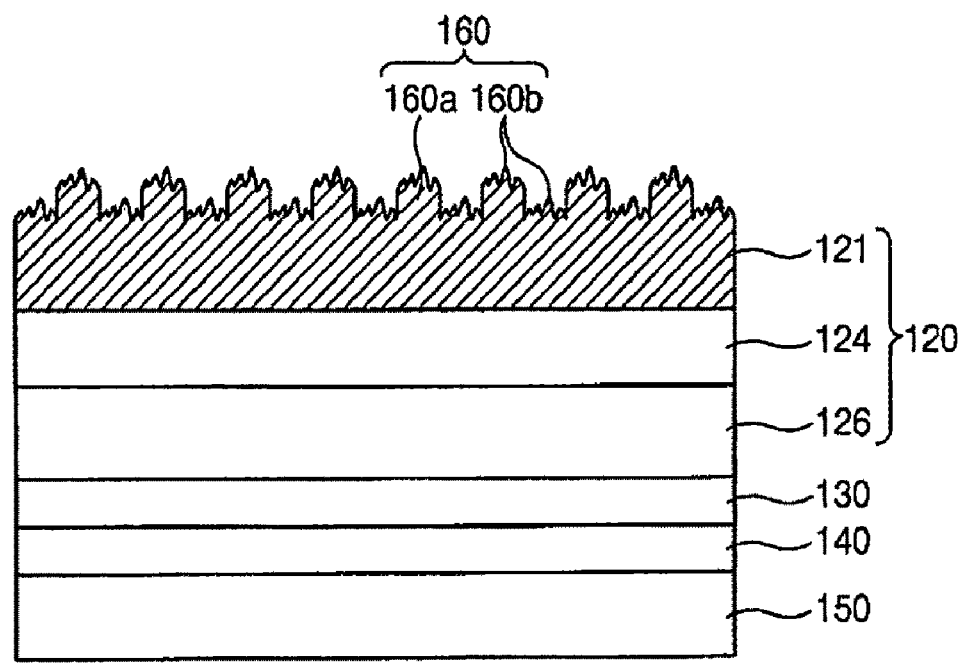

GALLIUM NITRIDE-BASED LIGHT EMITTING DIODE AND METHOD OF MANUFACTURING THE SAME

CROSS-REFERENCE TO RELATED APPLICATIONS

This application claims the benefit of Korean Patent Application No. 10-2006-0076592 filed with the Korean Intellectual Property Office on Aug. 14, 2006, the disclosure of which is incorporated herein by reference.

BACKGROUND OF THE INVENTION

1. Field of the Invention

The present invention relates to a vertical gallium nitride-based light emitting diode (hereinafter, referred to as a vertical GaN-based LED) and a method of manufacturing the same, which can increases light extraction efficiency, thereby enhancing external quantum efficiency.

2. Description of the Related Art

Generally, GaN-based LEDs are grown on a sapphire substrate. The sapphire substrate is a rigid nonconductor and has a low thermal conductivity. Therefore, it is difficult to reduce the size of the GaN-based LED for cost-down or improve the optical power and chip characteristics. Particularly, heat dissipation is very important for the LEDs because a high current should be applied to the GaN-based LEDs so as to increase the optical power of the GaN-based LEDs. To solve these problems, a vertical GaN-based LED has been proposed. In the vertical GaN-based LED, the sapphire substrate is removed using a laser lift-off (hereinafter, referred to as LLO) technology.

In general vertical GaN-based LEDs, however, efficiency where photons to be generated from an active layer are emitted to the outside is degraded. That is, luminance is degraded.

To solve such a problem, surface irregularities formed at even or uneven intervals are provided in a conventional vertical GaN-based LED, thereby enhancing luminance.

Now, a conventional vertical GaN-based LED will be described with reference to FIGS. 1 and 2. FIGS. 1 and 2 are perspective views illustrating the conventional vertical GaN-based LED.

Referring to FIGS. 1 and 2, the conventional vertical GaN-based LED has a positive electrode (p-electrode) 130 formed on a structure support layer 150. On the p-electrode 130, a p-type GaN layer 126, an active layer 124, and an n-type GaN layer 121 are sequentially formed, thereby forming a light-emission structure 120.

On the light-emission structure 120, that is, on the surface of the n-type GaN layer 126, an irregular-surface structure 160 for enhancing light extraction efficiency is formed. On the irregular-surface structure 160, a negative electrode (n-electrode) 170 is formed.

More specifically, FIG. 1 shows a state where the irregular-surface structure 160 of the n-type GaN layer 126 has irregularities formed at even intervals. FIG. 2 shows a state where the irregular-surface structure 160 of the n-type GaN layer 126 has irregularities formed at uneven intervals.

However, when the irregular-surface structure 160 of the n-type GaN layer 126 is formed at even or uneven intervals as described above, the surface where surface irregularities can be formed, that is, the surface of the n-type GaN layer is limited. Therefore, an improvement effect of luminance is not enough.

Therefore, a new method for maximizing an improvement effect of luminance is being required in this technical field.

SUMMARY OF THE INVENTION

An advantage of the present invention is that it provides a vertical GaN-based LED in which an irregular-surface structure composed of an irregular-surface structure with even intervals and an irregular-surface structure with uneven intervals is formed on a light-emission portion of the vertical GaN-based LED. Therefore, light extraction efficiency is enhanced so that an improvement effect of luminance can be maximized.

Another advantage of the invention is that it provides a method of manufacturing the vertical GaN-based LED.

Additional aspect and advantages of the present general inventive concept will be set forth in part in the description which follows and, in part, will be obvious from the description, or may be learned by practice of the general inventive concept.

According to an aspect of the invention, a vertical GaN-based LED comprises an n-electrode; an n-type GaN layer formed under the n-electrode, the n-type GaN layer having an irregular-surface structure which includes a first irregular-surface structure having irregularities formed at even intervals and a second irregular-surface structure having irregularities formed at uneven intervals, the second irregular-surface structure being formed on the first irregular-surface structure; an active layer formed under the n-type GaN layer; a p-type GaN layer formed under the active layer; a p-electrode formed under the p-type GaN layer; and a structure support layer formed under the p-electrode.

According to another aspect of the invention, the vertical GaN-based LED further comprises a transparent conductive layer formed on the entire surface of the n-type GaN layer, the transparent conductive layer being positioned between the n-electrode and the n-type GaN layer.

According to a further aspect of the invention, a method of manufacturing a vertical GaN-based LED comprises sequentially forming an n-type GaN layer, an active layer, and a p-type GaN layer on a substrate; forming a p-electrode on the p-type GaN layer; forming a structure support layer on the p-electrode; removing the substrate so as to expose the surface of the n-type GaN layer; forming a first irregular-surface structure with even intervals on the exposed surface of the n-type GaN layer; forming a second irregular-surface structure with uneven intervals on the first irregular-surface structure; and forming an n-electrode on the n-type GaN layer having the first and second irregular-surface structures formed thereon.

According to a still further aspect of the invention, the forming of the first irregular-surface structure includes forming a predetermined shape of photoresist pattern with even intervals on the exposed n-type GaN layer; and selectively etching portions of the n-type GaN layer by using the photoresist pattern as an etching mask.

According to a still further aspect of the invention, the forming of the second irregular-surface structure is performed by using a dry-etching or wet-etching process.

According to a still further aspect of the invention, the method further comprises forming a transparent conductive layer on the n-type GaN layer, before the forming of the n-electrode.

According to a still further aspect of the invention, a method of manufacturing a vertical GaN-based LED comprises patterning the surface of a substrate into an irregularity pattern with even intervals; forming an n-type GaN layer such that the surface of the n-type GaN layer coming in contact with the substrate patterned into the irregularity pattern has a first irregular-surface structure with even intervals in accordance with the irregularity pattern; sequentially forming an active layer and a p-type GaN layer on the n-type GaN layer; forming a p-electrode on the p-type GaN layer; forming a structure support layer on the p-electrode; removing the substrate so as to expose the first irregular-surface structure of the n-type GaN layer; forming a second irregular-surface structure with uneven intervals on the exposed surface of the first irregular-surface structure; and forming an n-electrode on the n-type GaN layer having the first and second irregular-surface structures formed thereon.

According to a still further aspect of the invention, the patterning of the substrate includes forming a predetermined shape of photoresist pattern with even intervals on the substrate; and selectively etching portions of the substrate by using the photoresist pattern as an etching mask.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1 and 2 are perspective views illustrating a conventional vertical GaN-based LED;

FIG. 3 is a perspective view of a vertical GaN-based LED according to an embodiment of the invention;

FIG. 4 is a photograph for explaining an irregular-surface structure according to the embodiment of the invention;

FIG. 5 is a diagram comparatively showing luminance values of the vertical GaN-based LEDs shown in FIGS. 1 and 3, respectively;

FIG. 6 is a perspective view illustrating a modification of the vertical GaN-based LED according to the invention;

FIGS. 7A to 7E are sectional views sequentially showing a method of manufacturing a vertical GaN-based LED according to a first embodiment of the invention; and FIGS. 8A to 8E are sectional views sequentially showing a method of manufacturing a vertical GaN-based LED according to a second embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, a vertical GaN-based LED and a method of manufacturing the same according to an embodiment of the present invention will be described in detail with reference to the accompanying drawings.

Structure of Vertical GaN-Based LED

Referring to FIG. 3, the structure of a vertical GaN-based LED according to an embodiment of the invention will be described in detail.

FIG. 3 is a perspective view of the vertical GaN-based LED according to an embodiment of the invention.

As shown in FIG. 3, the vertical GaN-based LED has an n-electrode 170 formed in the uppermost portion thereof, the n-electrode 170 being composed of Ti/Al or the like.

Under the n-electrode 170, an n-type GaN layer 121 is formed. On the n-type GaN layer 121, an irregular-surface structure 160 is formed, including a first irregular-surface structure 160a and a second irregular-surface structure 160b formed on the first irregular-surface structure 160a. The first irregular-surface structure 160a has irregularities formed at even intervals, and the second irregular-surface structure 160b has irregularities formed at uneven intervals.

FIG. 4 is a photograph for explaining the irregular-surface structure according to the embodiment of the invention. Referring to FIG. 4, a structure composed of large protrusions formed in a contour-line shape at even intervals indicates the first irregular-surface structure, and a structure composed of small protrusions formed at uneven intervals indicates the second irregular-surface structure.

Since a substantial surface area of the upper surface of the n-type GaN layer 121 is increased by the first irregular-surface structure 160a with even intervals, the second irregular-surface structure 160b can be formed to have a larger number of surface irregularities.

As described above, when the second irregular-surface structure 160b with uneven intervals is provided on the n-type GaN layer 121 in a state where the surface area of the n-type GaN layer 121 serving a light-emitting portion of the vertical GaN-based LED is increased by the first regular surface structure 160a with even intervals, the vertical GaN-based LED has larger luminance than in a case where an irregular-surface structure with uneven intervals is provided on the flat surface of the n-type GaN layer 121, which can be found in FIG. 5. FIG. 5 is a diagram comparatively showing luminance values of the vertical GaN-based LEDs shown in FIGS. 1 and 3, respectively.

The shape of the first surface irregular structure 160a, which enhances a diffusion characteristic of photons generated in an active layer so as to effectively discharge the photons to the outside, is not limited. In this embodiment, the side surface of an irregularity of the first surface irregular structure 160a is formed in a rectangular shape. Without being limited to the rectangular shape, however, the side surface of an irregularity of the first surface irregular structure 160a can be formed in a hemispheric shape or triangle shape.

Under the n-type GaN layer 121, a light-emission structure 120 is formed, in which an active layer 124 and a p-type GaN layer 126 are sequentially laminated.

The n-type or the p-type GaN layer 121 or 126 in the light-emission structure 120 may be a GaN layer or GaN/AlGaN layer doped with n-type or p-type conductive impurities. The active layer 124 can be formed to have a multi-quantum well structure composed of an InGaN/GaN layer.

Under the p-type GaN layer 126 of the light-emission structure 120, a p-electrode 130 is formed. Although not shown, the p-electrode and a reflecting film may be sequentially laminated under the p-type GaN layer 126. When a reflecting film is not provided, the p-electrode serves as a reflecting film.

Under the p-electrode 130, a structure support layer 150 is bonded by a conductive bonding layer 140. The structure support layer 150, serving as a support layer and electrode of a finalized LED, is formed of a silicon (Si) substrate, a GaAs substrate, a Ge substrate, or a metallic layer. The metallic layer can be formed by an electroplating method, an electroless plating method, a thermal evaporating method, an e-beam evaporating method, a sputtering method, a chemical vapor deposition (CVD) method.

In this embodiment, in order to enhance a current spreading effect, a transparent conductive layer 180 composed of CIO/ITO may be formed on the entire upper surface of the n-type GaN layer 121, before the n-electrode 170 is formed, as shown in FIG. 6. FIG. 6 is a perspective view illustrating a modification of the vertical GaN-based LED according to the invention.

Method of Manufacturing Vertical GaN-Based LED

First Embodiment

First, a method of manufacturing a vertical GaN-based LED according to a first embodiment of the invention will be described in detail with reference to FIGS. 3 and 7A to 7E.

FIGS. 7A to 7E are sectional views sequentially showing the method of manufacturing a vertical GaN-based LED according to the first embodiment of the invention.

As shown in FIG. 7A, a light-emission structure 120 composed of a GaN-based semiconductor layer is formed on a substrate 100. In the light-emission structure 120, an n-type GaN layer 121, an active layer 124 formed of a GaN/InGaN layer having a multi-quantum well structure, and a p-type GaN layer 126 are sequentially laminated.

Preferably, the substrate 100 is formed of a transparent material including sapphire. In addition to sapphire, the substrate 100 may be formed of ZnO (zinc oxide), GaN (gallium nitride), SiC (silicon carbide), or AlN (aluminum nitride).

The n-type and p-type GaN-based semiconductor layer 121 and 126 and the active layer 124 may be formed of GaN-based semiconductor materials having a compositional formula of $Al_xIn_yGa_{(1-x-y)}N$ (here, $0 \leq x \leq 1$, $0 \leq y \leq 1$, and $0 \leq x+y \leq 1$). Further, the n-type and p-type GaN-based semiconductor layer 121 and 126 and the active layer 124 may be formed through a well-known nitride deposition process such as MOCVD (Metal Organic Chemical Vapor Deposition) or MBE (Molecular Beam Epitaxy).

The active layer 124 may be formed to have a single-quantum well structure or double-hetero structure.

Although not shown, a buffer layer may be formed before the n-type GaN layer 121 is grown on the substrate 100. The buffer layer serves to enhance lattice matching between the substrate 100 and the n-type GaN layer 121. The buffer layer may be omitted depending on a process condition and a characteristic of an LED.

Next, as shown in FIG. 7B, a p-electrode 130 is formed on the p-type GaN layer 126. The p-electrode 130 can serve as a reflecting film. Meanwhile, a separate reflecting film (not shown) may be formed on the p-electrode 130.

Subsequently, a structure support layer 150 is bonded on the p-electrode 130 by a conductive bonding layer 140. The structure support layer 150, serving as a support layer and electrode of a finalized LED, is formed of a silicon (Si) substrate, a GaAs substrate, a Ge substrate or a metallic layer. The metallic layer can be formed by an electroplating method, an electroless plating method, a thermal evaporating method, an e-beam evaporating method, a sputtering method, a chemical vapor deposition (CVD) method.

Next, as shown in FIG. 7C, the substrate 100 is removed by an LLO (laser lift-off) process such that the surface of the n-type GaN layer 121 is exposed.

Continuously, as shown in FIG. 7D, a first irregular-surface structure 160a with even intervals is formed on the exposed n-type GaN layer 121.

More specifically, the first irregular-surface structure 160a is formed as follows. A predetermined shape of photoresist pattern (not shown) with even intervals is formed on the upper surface of the exposed n-type GaN layer 121. Then, portions of the n-type GaN layer 121 is selectively etched by using the photoresist pattern as an etching mask, thereby forming the first irregular-surface structure 160a.

Next, as shown in FIG. 7E, a second irregular-surface structure 160b with uneven intervals is formed on the n-type GaN layer 121 having the first irregular-surface structure 160a formed thereon. The second irregular-surface structure 160b may be formed by a wet-etching process using an etching solution such as KOH, a dry-etching process using an ICP-RIE (Induced Coupled Plasma Reactive Ion Etcher), or a combination of a wet-etching process and a dry-etching process.

That is, an irregular-surface structure 160 including the first and second irregular-surface structures 160a and 160b is formed on the surface of the n-type GaN layer 121.

Subsequently, as shown in FIG. 3, an n-electrode 170 is formed on the n-type GaN layer 121 having the irregular-surface structure 160 formed thereon, thereby forming the vertical GaN-based LED.

Although not shown, a transparent conductive layer composed of CIO/ITO may be formed on the entire upper surface of the n-type GaN layer 121 before the n-electrode 170 is formed, in order to enhance a current spreading effect.

Second Embodiment

Referring to FIGS. 3 and 8A to 8E, a method of manufacturing a vertical GaN-based LED according to a second embodiment of the invention will be described in detail.

FIGS. 8A to 8E are sectional views sequentially showing the method of manufacturing a vertical GaN-based LED according to the second embodiment of the invention.

As shown in FIG. 8A, first, a predetermined shape of photoresist pattern 200 with even intervals is formed on a substrate 100. Preferably, the substrate 100 is formed of a transparent material including sapphire. In addition to sapphire, the substrate 100 may be formed of ZnO (zinc oxide), GaN (gallium nitride), SiC (silicon carbide), or AlN (aluminum nitride).

Then, as shown in FIG. 8B, portions of the substrate 100 are selectively etched by using the photoresist pattern 200 as an etching mask such that an irregularity pattern 100a with even intervals is formed.

As shown in FIG. 8C, a GaN-based semiconductor layer is crystal-grown on the substrate 100 having the irregularity pattern 100a formed thereon such that an n-type GaN layer 121 is formed. At this time, the n-type GaN layer 121 is formed to have a first irregular-surface structure 160a with even intervals which is formed in accordance with the irregularity pattern 100a of the substrate 100.

Next, on the n-type GaN layer 121, an active layer 124 and a p-type GaN layer 126 are sequentially crystal-grown, thereby forming a light-emission structure 120 in which the p-type GaN layer 126, the active layer 124, and the n-type GaN layer 121 are sequentially laminated. Then, a p-electrode 130 is formed on the light-emission structure 120. At this time, the p-electrode 130 can serve as a reflecting film. Meanwhile, a separate reflecting film (not shown) may be formed on the p-electrode 130.

Continuously, a structure support layer 150 is bonded on the p-electrode 130 by a conductive bonding layer 140. The structure support layer 150, serving as a support layer and electrode of a finalized LED, is formed of a silicon (Si) substrate, a GaAs substrate, a Ge substrate or a metallic layer. The metallic layer can be formed by an electroplating method, an electroless plating method, a thermal evaporating method, an e-beam evaporating method, a sputtering method, a chemical vapor deposition (CVD) method.

Then, as shown in FIG. 8D, the substrate 100 is removed through an LLO process such that the first irregular-surface structure 160a of the n-type GaN layer 121 is exposed.

Next, as shown in FIG. 8E, a second irregular-surface structure 160b with uneven intervals is formed on the n-type GaN layer 121 having the exposed first irregular-surface structure 160a. At this time, the second irregular-surface structure 160b may be formed by a wet-etching process using an etching solution such as KOH, a dry-etching process using an ICP-RIE (Induced Coupled Plasma Reactive Ion Etcher), or a combination of a wet-etching process and a dry-etching process.

That is, on the surface of the n-type GaN layer 121, the irregular-surface structure 160 including the first and second irregular-surface structures 160a and 160b is formed.

Subsequently, as shown in FIG. 3, an n-electrode 170 is formed on the n-type GaN layer 121 having the irregular-surface structure 160 formed thereon, thereby forming the vertical GaN-based LED.

Although not shown, a transparent conductive layer composed of CIO/ITO may be formed on the entire upper surface of the n-type GaN layer 121 before the n-electrode 170 is formed, in order to enhance a current spreading effect.

According to the invention, the irregular-surface structure including the first irregular-surface structure with even intervals and the second irregular-surface structure with uneven intervals is formed on the light-emitting portion of the vertical GaN-based LED. Therefore, light extraction efficiency is increased so that an improvement effect of luminance can be maximized.

Further, the second irregular-surface structure with uneven intervals is formed on the surface of the n-type GaN layer having an area increased by the first irregular-surface structure with even intervals, thereby increasing a formation area of the second irregular-surface structure with uneven intervals.

Therefore, it is possible to enhance a luminance characteristic of the vertical GaN-based LED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A vertical GaN-based LED comprising:
   an n-electrode;
   an n-type GaN layer formed under the n-electrode, the n-type GaN layer having an irregular-surface structure on a surface thereof, which includes a plurality of first irregular-surface structures formed at periodic intervals wherein each of the plurality of the first irregular-surface structures have irregularities formed at non-periodic intervals,
   an active layer formed under the n-type GaN layer;
   a p-type GaN layer formed under the active layer;
   a p-electrode formed under the p-type GaN layer; and
   a structure support layer formed under the p-electrode,
   wherein each of the first irregular-surface structures has a hexahedron shape having an upper surface and a side surface, and the side surface of each of the first irregular-surface structures is devoid of the irregularities.

2. The vertical GaN-based LED according to claim 1 further comprising
   a transparent conductive layer formed on the entire surface of the n-type GaN layer, the transparent conductive layer being positioned between the n-electrode and the n-type GaN layer.

3. A method of manufacturing a vertical GaN-based LED comprising:
   sequentially forming an n-type GaN layer, an active layer, and a p-type GaN layer on a substrate;
   forming a p-electrode on the p-type GaN layer;
   forming a structure support layer on the p-electrode;
   removing the substrate so as to expose the surface of the n-type GaN layer;
   forming a plurality of first irregular-surface structures with-periodic intervals on the exposed surface of the n-type GaN layer;
   forming irregularities with non-periodic intervals on each of the plurality of first irregular-surface structures; and
   forming an n-electrode on the n-type GaN layer having the first irregular-surface structures formed thereon,
   wherein each of the first irregular-surface structures has a hexahedron shape having an upper surface and a side surface, and the side surface of each of the first irregular-surface structures is devoid of the irregularities.

4. The method according to claim 3,
   wherein the forming of the first irregular-surface structure includes:
   forming a predetermined shape of photoresist pattern with even intervals on the exposed n-type GaN layer; and
   selectively etching portions of the n-type GaN layer by using the photoresist pattern as an etching mask.

5. The method according to claim 3,
   wherein the forming of the irregularities on each of the plurality of first irregular-surface structures is performed by using a dry-etching or wet-etching process.

6. The method according to claim 3 further comprising
   forming a transparent conductive layer on the n-type GaN layer, before the forming of the n-electrode.

7. A method of manufacturing a vertical GaN-based LED comprising:
   patterning the surface of a substrate into an irregularity pattern with even intervals;
   forming an n-type GaN layer such that the surface of the n-type GaN layer coming in contact with the substrate patterned into the irregularity pattern has a plurality of first irregular-surface structures with periodic intervals in accordance with the irregularity pattern;
   sequentially forming an active layer and a p-type GaN layer on the n-type GaN layer;
   forming a p-electrode on the p-type GaN layer;
   forming a structure support layer on the p-electrode;
   removing the substrate so as to expose the first irregular-surface structure of the n-type GaN layer;
   forming irregularities with non-periodic intervals on the exposed surface of the plurality of first irregular-surface structures; and
   forming an n-electrode on the n-type GaN layer having the first irregular-surface structures formed thereon,
   wherein each of the first irregular-surface structures have a hexahedron shape having an upper surface and a side surface, and the side surface of each of the first irregular-surface structures is devoid of the irregularities.

8. The method according to claim 7,
   wherein the patterning of the substrate includes:
   forming a predetermined shape of photoresist pattern with even intervals on the substrate; and
   selectively etching portions of the substrate by using the photoresist pattern as an etching mask.

9. The method according to claim 7,
wherein the forming of the irregularities with non-periodic intervals on the exposed surface of the plurality of first irregular-surface structures is performed by a dry-etching or wet-etching process.

10. The method according to claim 7 further comprising forming a transparent conductive layer on the n-type GaN layer, before the forming of the n-electrode.

* * * * *